(12) United States Patent
Hsieh et al.

(10) Patent No.: US 10,014,250 B2
(45) Date of Patent: Jul. 3, 2018

(54) SEMICONDUCTOR DEVICES

(71) Applicant: Advanced Semiconductor Engineering, Inc., Kaohsiung (TW)

(72) Inventors: Sheng-Chi Hsieh, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 12 days.

(21) Appl. No.: 15/019,783

(22) Filed: Feb. 9, 2016

(65) Prior Publication Data

US 2017/0229393 A1    Aug. 10, 2017

(51) Int. Cl.

| | |
|---|---|
| *H01F 27/28* | (2006.01) |
| *H01F 5/00* | (2006.01) |
| *H01F 17/00* | (2006.01) |
| *H01L 23/522* | (2006.01) |
| *H01L 23/498* | (2006.01) |

(52) U.S. Cl.
CPC .... *H01L 23/5227* (2013.01); *H01L 23/49822* (2013.01)

(58) Field of Classification Search
CPC .............. H03H 7/0115; H03H 7/0123; H03H 2007/013; H03H 7/0078; H01L 28/00; H01L 28/10; H01L 23/5227; H01L 23/645; H01L 27/0288
See application file for complete search history.

(56) References Cited

U.S. PATENT DOCUMENTS

| | | | | |
|---|---|---|---|---|
| 4,888,568 | A * | 12/1989 | Kawaguchi | H03H 7/0115 333/172 |
| 5,602,517 | A * | 2/1997 | Kaneko | H03H 7/0115 333/185 |
| 5,977,845 | A * | 11/1999 | Kitahara | H03H 7/0115 333/184 |
| 6,429,504 | B1 | 8/2002 | Beaussart et al. | |
| 6,429,764 | B1 * | 8/2002 | Karam | H01F 17/0033 29/602.1 |
| 6,476,689 | B1 * | 11/2002 | Uchida | H03H 1/0007 333/177 |
| 6,483,400 | B1 * | 11/2002 | Phillips, Jr. | H03H 7/0115 333/175 |

(Continued)

*Primary Examiner* — Mary Wilczewski
*Assistant Examiner* — Tsz Chiu
(74) *Attorney, Agent, or Firm* — Foley & Lardner LLP; Cliff Z. Liu

(57) ABSTRACT

A semiconductor device includes a substrate and at least one inductor on the substrate. The inductor includes top portions separated from one another, bottom portions separated from one another, and side portions separated from one other. Each side portion extends between one of the top portions and one of the bottom portions. A semiconductor device includes a substrate, a first patterned conductive layer on the substrate, a second patterned conductive layer, and at least one dielectric layer between the first patterned conductive layer and the second patterned conductive layer. The first patterned conductive layer defines bottom crossbars separated from each other, each bottom crossbar including a bend angle. The second patterned conductive layer defines top crossbars separated from each other, wherein each top crossbar is electrically connected to a bottom crossbar.

19 Claims, 5 Drawing Sheets

(56) References Cited

U.S. PATENT DOCUMENTS

| | | | |
|---|---|---|---|
| 6,504,227 B1* | 1/2003 | Matsuo | H01L 23/481 257/528 |
| 6,873,513 B2* | 3/2005 | Anthony | H01G 4/012 257/E23.079 |
| 6,975,199 B2 | 12/2005 | Long et al. | |
| 7,084,708 B2 | 8/2006 | Sugiura et al. | |
| 7,259,648 B2* | 8/2007 | Matsutani | H01F 27/027 336/200 |
| 7,274,549 B2* | 9/2007 | Anthony | H05K 9/0052 361/111 |
| 7,924,131 B2* | 4/2011 | Walls | H01F 17/0013 336/200 |
| 8,618,902 B2* | 12/2013 | Nogi | H01F 17/0013 336/192 |
| 8,981,866 B2 | 3/2015 | Frye et al. | |
| 9,009,951 B2* | 4/2015 | Chang | H01F 5/003 29/592.1 |
| 9,041,152 B2 | 5/2015 | Luo et al. | |
| 2011/0109417 A1* | 5/2011 | Bertram | H01F 19/04 336/200 |
| 2015/0201495 A1* | 7/2015 | Kim | H05K 1/0306 174/255 |

* cited by examiner

US 10,014,250 B2

SEMICONDUCTOR DEVICES

BACKGROUND

1. Technical Field

The present disclosure relates to a semiconductor device. In particular, the present disclosure relates to a semiconductor device having integrated passive components.

2. Description of the Related Art

A three-dimensional (3D) inductor structure (e.g., formed through multiple layers of a multi-layer structure) may be formed on a semiconductor substrate, and may be surrounded by a passivation layer. Quality of the 3D inductor structure may be related to a height thereof. In some implementations, a relatively tall 3D inductor structure may be desirable; however, height of the 3D inductor structure is constrained by the passivation layer. Additionally, greater height of the 3D inductor structure and greater thickness of the passivation layer (e.g., to accommodate a 3D inductor structure of greater height) also result in higher cost.

SUMMARY

In an embodiment, a semiconductor device includes a substrate and at least one inductor on the substrate. The inductor includes top portions separated from one another, bottom portions separated from one another, and side portions separated from one other. Each side portion extends between one of the top portions and one of the bottom portions.

In an embodiment, a semiconductor device includes a substrate, a first patterned conductive layer on the substrate, a second patterned conductive layer, and at least one dielectric layer between the first patterned conductive layer and the second patterned conductive layer. The first patterned conductive layer defines bottom crossbars separated from each other, each bottom crossbar including a bend angle. The second patterned conductive layer defines top crossbars separated from each other, wherein each top crossbar is electrically connected to a bottom crossbar.

In an embodiment, a semiconductor device includes a substrate, a first patterned conductive layer on the substrate, a first dielectric layer on the substrate and covering the first patterned conductive layer, a second patterned conductive layer on the first dielectric layer, a second dielectric layer on the first dielectric layer and covering the second patterned conductive layer, and a third patterned conductive layer on the second dielectric layer. Traces in the first patterned conductive layer and traces in the third patterned conductive layer are electrically connected to form an inductor. The traces in the first patterned conductive layer are positioned with respect to the traces in the third patterned conductive layer such that, during operation of the inductor, an out-of-phase current developed in the inductor is minimized or reduced.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. The techniques are cost effective, and are compatible with forming "2.5D" and 3D integrated circuit (IC) packages.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
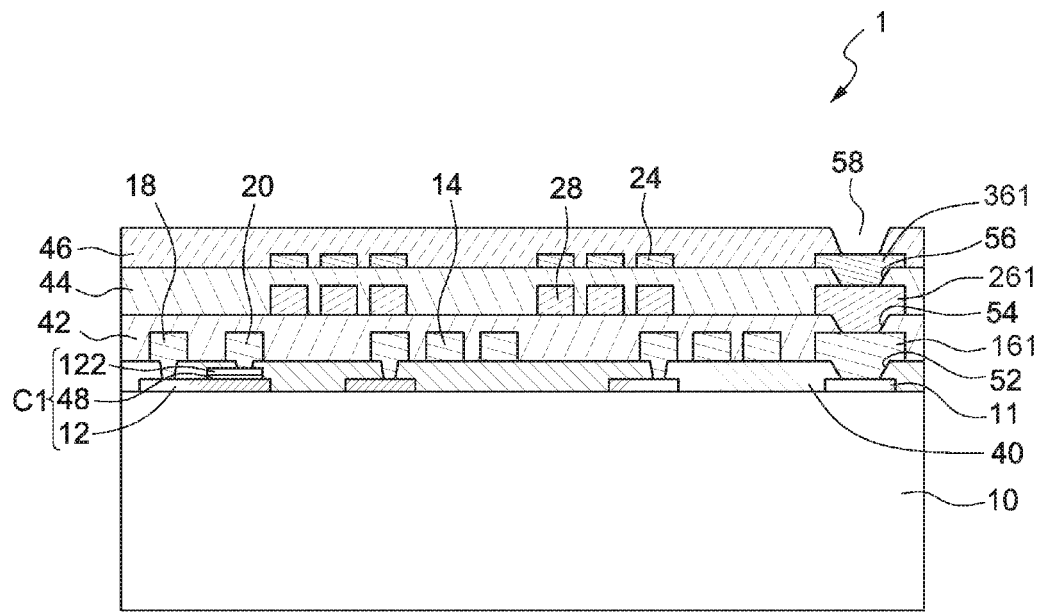
FIG. 1 is a cross-sectional view of a semiconductor device in accordance with an embodiment of the present disclosure.

FIG. 1 is a cross-sectional view of a semiconductor device 1 in accordance with an embodiment of the present disclosure. The semiconductor device 1 includes a substrate 10, patterned conductive layers 11, 12, 122, 14, 24 and 28, interconnection structures 161, 18, 20, 261 and 361, and insulating layers 40, 42, 44, 46 and 48.

In one or more embodiments, the substrate 10 includes glass, silicon, silicon dioxide ($SiO_2$), or a combination thereof. In one or more embodiments, a thickness of the substrate 10 is in a range of about 200 micrometers (μm) to about 300 μm. In one or more embodiments, the substrate 10 may include one or more active components (e.g., ICs) embedded in the substrate 10, and/or one or more active components disposed on the substrate 10. In one or more embodiments, the substrate 10 may include one or more passive components (e.g., a capacitor C1 as shown in FIG. 1) disposed on the substrate 10. The patterned conductive layers 122 and 12, together with the insulating layer 48, form the capacitor C1.

The patterned conductive layer 11 is disposed on a top surface of the substrate 10 and is electrically connected to the interconnection structure 161. The capacitor C1 is disposed on the top surface of the substrate 10 and is electrically connected to the interconnection structures 18 and 20. The insulating layer 40 is disposed on the top surface of the substrate 10 and covers portions of the capacitor C1, and further covers portions of the patterned conductive layer 11 not used to form the capacitor C1. In one or more embodiments, a thickness of the insulating layer 40 is in a range of about 5 μm to about 10 μm. The interconnection structure 161 is disposed in an opening 52 of the insulating layer 40. The patterned conductive layer 14 and the interconnection structures 18 and 20 are disposed on a top surface of the insulating layer 40. The interconnection structure 18 is connected to the patterned conductive layer 12 and the interconnection structure 20 is connected to the patterned conductive layer 122.

The insulating layer 42 is disposed on the top surface of the insulating layer 40 and covers the patterned conductive layer 14 and a portion of the interconnection structures 161, 18 and 20. In one or more embodiments, a thickness of the insulating layer 42 is in a range of about 20 μm to about 30 The interconnection structure 261 is disposed in an opening 54 of the insulating layer 42 and is electrically connected to the interconnection structure 161. The patterned conductive layer 28 is disposed on a top surface of the insulating layer 42. The insulating layer 44 is disposed on the top surface of the insulating layer 42 and covers the patterned conductive layer 28 and a portion of the interconnection structure 261. In one or more embodiments, a thickness of the insulating layer 44 is in a range of about 20 μm to about 30 μm.

The interconnection structure 361 is disposed in an opening 56 of the insulating layer 44 and is electrically connected to the interconnection structure 261. The patterned conductive layer 24 is disposed on a top surface of the insulating layer 44. The insulating layer 46 is disposed on the top surface of the insulating layer 44 and covers the patterned conductive layer 24 and a portion of the interconnection structure 361. In one or more embodiments, a thickness of the insulating layer 46 is in a range of about 20 μm to about 30 μm.

In one or more embodiments, one or more of the patterned conductive layers 11, 12, 14, 24, 28 and 122 include copper (Cu), another suitable metal, an alloy, or a combination thereof; in other embodiments, one or more of the patterned conductive layers 11, 12, 14, 24, 28 and 122 include another suitable conductive material. The patterned conductive layers 11, 12, 14, 24, 28 and 122 may include the same or similar materials; however, ones of the patterned conductive layers 11, 12, 14, 24, 28 and 122 may include materials different than others of the patterned conductive layers 11, 12, 14, 24, 28 and 122.

In one or more embodiments, one or more of the insulating layers 40, 42, 44, 46 and 48 include a metal oxide; in other embodiments, one or more of the insulating layers 40, 42, 44, 46 and 48 include another suitable insulative material. The insulating layers 40, 42, 44, 46 and 48 may include the same or similar materials; however, ones of the insulating layers 40, 42, 44, 46 and 48 may include materials different than others of the insulating layers 40, 42, 44, 46 and 48.

In one or more embodiments, the patterned conductive layers 14 and 24, together with the interconnection structures 161 and 361, form an inductor. In one or more embodiments, the patterned conductive layers 14 and 28, together with the interconnection structures 161 and 261, form an inductor. In one or more embodiments, the patterned conductive layers 28 and 24, together with the interconnection structures 261 and 361, form an inductor.

Figure 2:
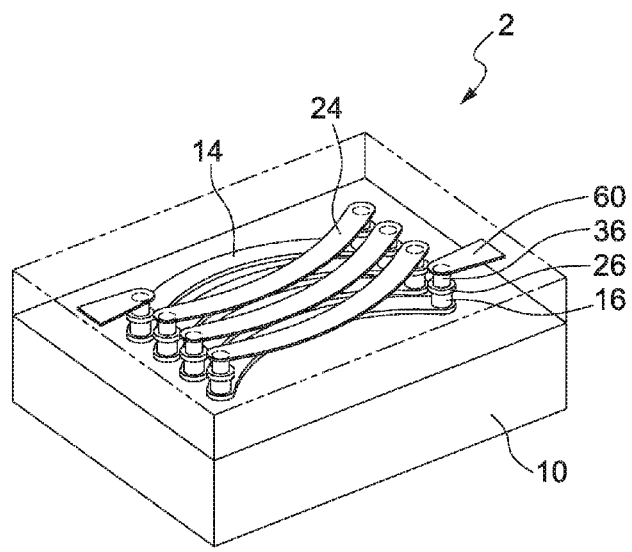
FIG. 2 is a side-sectional view of a semiconductor device in accordance with an embodiment of the present disclosure.

FIG. 2 is a perspective view of a semiconductor device 2 in accordance with an embodiment of the present disclosure. The semiconductor device 2 includes a substrate 10, patterned conductive layers 14 and 24, interconnection structures 16, 26 and 36, and a conductive pattern 60. Insulating layers (e.g., similar to the insulating layers 40, 42, 44 or 46 illustrated in FIG. 1) are included in the embodiment of FIG. 2 but are not illustrated in FIG. 2, so that the structure of the patterned conductive layers 14 and 24 and the interconnection structures 16, 26, 36 can be shown.

In the embodiment of FIG. 2, the interconnection structures 16, 26, 36 are formed so as to be stacked in a columnar structure, and multiple columnar structures are included in the semiconductor device 2. In the embodiment illustrated in FIG. 2, the patterned conductive layers 14, 24 include traces in the form of crossbars between ones of the columnar structures.

Electrical coupling between crossbars of the patterned conductive layer 14 and crossbars of the patterned conductive layer 24 is made through the columnar structures as follows: a crossbar of the patterned conductive layer 14 is electrically coupled at a first end through a columnar structure to a crossbar of the patterned conductive layer 24, and may also be electrically coupled at a second end through another, different columnar structure to another, different, crossbar of the patterned conductive layer 24, as illustrated in FIG. 2. In this manner, a group of columnar structures and crossbars of the patterned conductive layers 14 and 24 can form an electrical path, and a combination of the columnar structures and the crossbars of the patterned conductive layers 14 and 24 may be used to form an inductor, as can be seen in FIG. 2.

In one or more embodiments, a single columnar structure may be replaced by multiple columnar structures, such as to provide for greater current flow between a crossbar of the patterned conductive layer 14 and a crossbar of the patterned conductive layer 24. In one or more embodiments, the interconnection structures 16, 26, 36 are formed similarly to the interconnection structures 161, 261 or 361 of FIG. 1.

In the embodiment of FIG. 2, the crossbars are each shown as being bowed, or having an arcuate shape. The crossbars of the patterned conductive layer 14 bow oppositely from the crossbars of the patterned conductive layer 24; however, in other embodiments, the crossbars of the patterned conductive layer 14 bow in a same direction as the crossbars of the patterned conductive layer 24. In one or more embodiments, the crossbars of the patterned conductive layer 14 have a same or similar curvature to the crossbars of the patterned conductive layer 24; in other embodiments, the curvature may be different between crossbars of the patterned conductive layer 14 and crossbars of the patterned conductive layer 24, or between individual ones of the crossbars of the patterned conductive layer 14, or between individual ones of the crossbars of the patterned conductive layer 24.

In one or more embodiments, a vertical distance between the crossbars of the patterned conductive layer 14 and the crossbars of the patterned conductive layer 24 is in a range of about 150 μm to about 300 μm.

The conductive pattern 60 is electrically connected to the interconnection structure 36 and is used for electrical connection (e.g., to another electrical circuit or another device).

Figure 3:
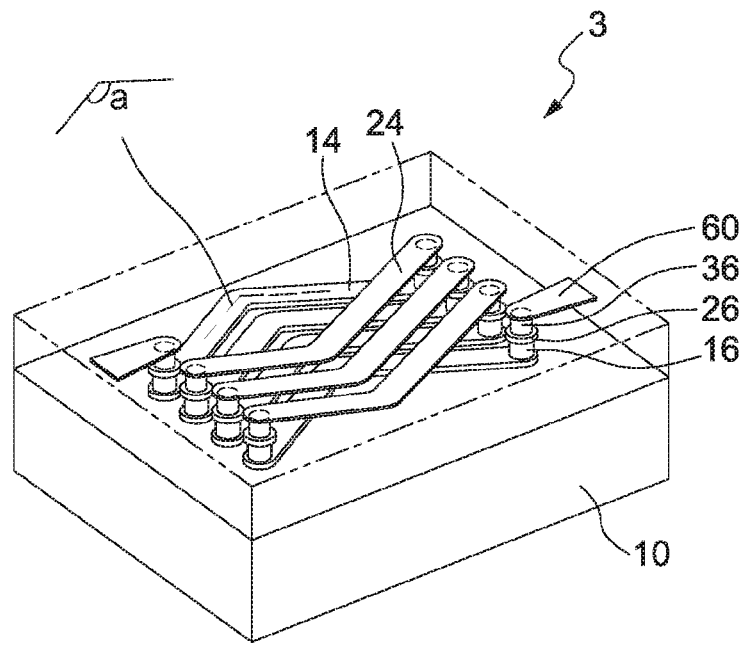
FIG. 3 is a side-sectional view of a semiconductor device in accordance with an embodiment of the present disclosure.

FIG. 3 is a perspective view of a semiconductor device 3 in accordance with an embodiment of the present disclosure. The semiconductor device 3 is similar to the semiconductor device 2 illustrated in FIG. 2, except that the crossbars of the patterned conductive layers 14 and 24 are angled (having generally straight segments connected through a bend angle) rather than bowed. By way of example of a bend angle, a bend angle 'a' between two segments is illustrated in FIG. 3, which is mapped (shown by dotted line) to one crossbar of the patterned conductive layer 14.

In one or more embodiments, a bend angle of each of the crossbars of the patterned conductive layer 14 is approximately the same, and a bend angle of each of the crossbars of the patterned conductive layer 24 is approximately the same, where the bend angle of the crossbars of the patterned conductive layer 14 may be approximately the same as or different from the bend angle of the crossbars of the patterned conductive layer 24. For example, in FIG. 3, the bend angle of the crossbars of the patterned conductive layer 14 is approximately equal to the bend angle of the crossbars of the patterned conductive layer 24, but the crossbars of the patterned conductive layer 14 bend in a direction opposite the crossbars in the patterned conductive layer 24. In the embodiment of FIG. 3, the crossbars of the patterned conductive layer 14 bend in a direction opposite from the bend of the crossbars of the patterned conductive layer 24; however, in other embodiments, the crossbars of the patterned conductive layer 14 bend in a same direction as the crossbars of the patterned conductive layer 24.

In one or more embodiments, the bend angles of ones of the crossbars of the patterned conductive layer 14 are different than the bend angles of others of the crossbars of the patterned conductive layer 14; and/or the bend angles of ones of the crossbars of the patterned conductive layer 24 are different than the bend angles of others of the crossbars of the patterned conductive layer 24.

In one or more embodiments, the bend angle of each of the crossbars of the patterned conductive layer 14 is approximately 90 degrees in one direction and the bend angle of each of the crossbars of the patterned conductive layer 24 is approximately 90 degrees in the opposite direction.

In one or more embodiments, the bend angle of each of the crossbars of the patterned conductive layer 14 and the patterned conductive layer 24 is less than approximately 90 degrees. In one or more embodiments, the bend angle of each of the crossbars of the patterned conductive layer 14 and the patterned conductive layer 24 is greater than approximately 90 degrees. In one or more embodiments, the bend angle of ones of the crossbars of the patterned conductive layer 14 and the patterned conductive layer 24 is different than the bend angle of others of the crossbars of the patterned conductive layer 14 and the patterned conductive layer 24.

When the bend angle is less than 90 degrees, the Q factor and inductance of the inductor of FIG. 3 will be increased in comparison to bend angles of 90 degrees or more.

Figure 4:
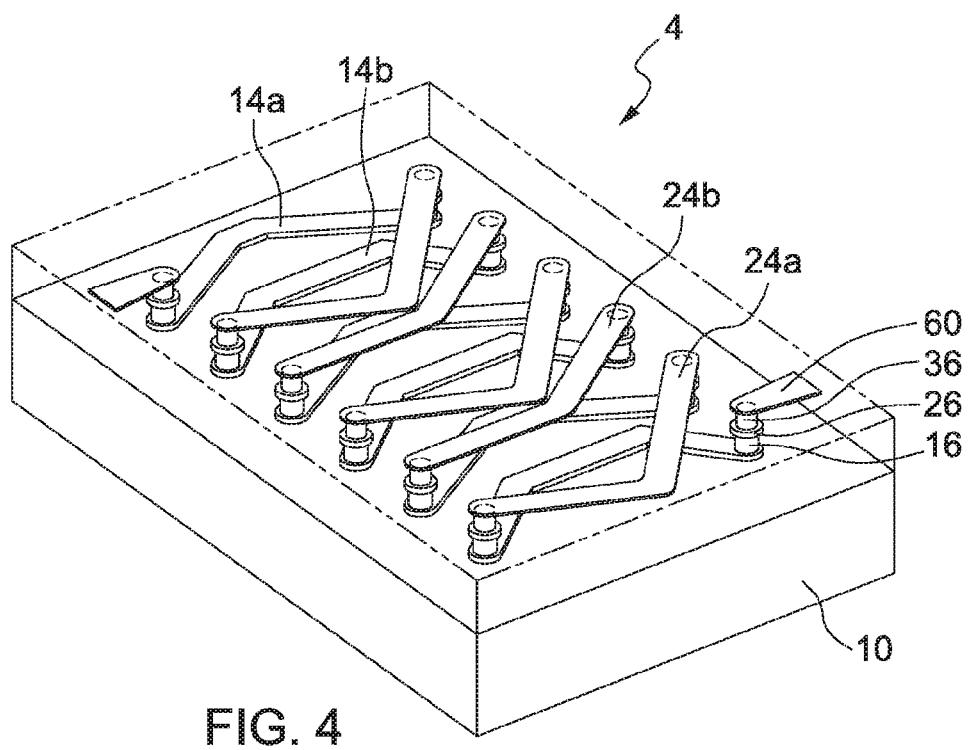
FIG. 4 is a side-sectional view of a semiconductor device in accordance with an embodiment of the present disclosure.

FIG. 4 is a perspective view of a semiconductor device 4 in accordance with an embodiment of the present disclosure. The semiconductor device 4 is similar to the semiconductor device 3 illustrated in FIG. 3, except that the crossbars of the patterned conductive layer 14 include a crossbar shape 14*a* and a crossbar shape 14*b*, and the crossbars of the patterned conductive layer 24 include a crossbar shape 24*a* and a crossbar shape 24*b*. The crossbar shapes 14*a* are interspersed with the crossbar shapes 14*b*, such that the crossbar shapes 14*a* and the crossbar shapes 14*b* are staggered, as shown. The crossbar shapes 24*a* are interspersed with the crossbar shapes 24*b*, such that the crossbar shapes 24*a* and the crossbar shapes 24*b* are staggered, as shown.

In the embodiment illustrated in FIG. 4, each of the crossbars of the patterned conductive layer 24 have a single bend angle, and each of the crossbars of the patterned conductive layer 14 have two bend angles, by way of illustration. However, the number of bend angles of the crossbars of the patterned conductive layer 24 is not limited to one, and the number of bend angles of the crossbars of the patterned conductive layer 14 is not limited to two. Further, the crossbars of the patterned conductive layer 14 do not necessarily each have the same number of bend angles, and the crossbars of the patterned conductive layer 24 do not necessarily each have the same number of bend angles. Additionally, instead of the crossbars of the patterned conductive layer 14 having more bend angles than the crossbars of the patterned conductive layer 24, the crossbars of the patterned conductive layer 14 may have fewer bend angles than the crossbars of the patterned conductive layer 24.

In the embodiment of FIG. 4, the crossbars of the patterned conductive layer 14 bend in a direction opposite from the bend of the crossbars of the patterned conductive layer 24; however, in other embodiments, the crossbars of the patterned conductive layer 14 bend in a same direction as the crossbars of the patterned conductive layer 24.

Figure 5:
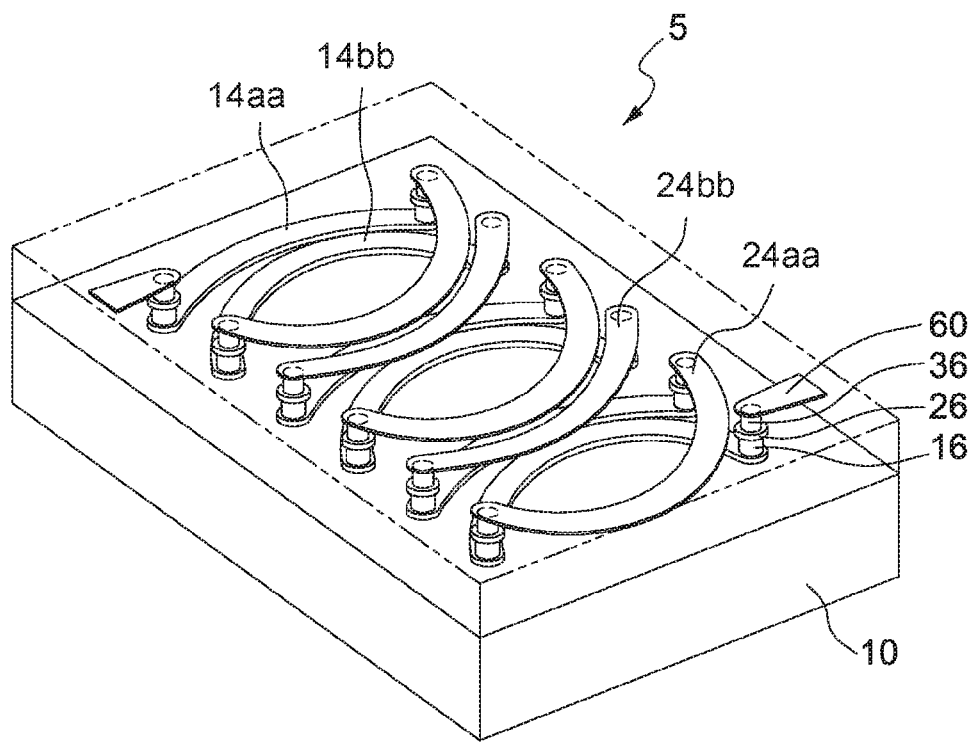
FIG. 5 is a side-sectional view of a semiconductor device in accordance with an embodiment of the present disclosure.

FIG. 5 is a perspective view of a semiconductor device 5 in accordance with an embodiment of the present disclosure. The semiconductor device 5 is similar to the semiconductor device 2 illustrated in FIG. 2, except that FIG. 5 illustrates that a curvature (e.g., a radius of curvature, or an elliptical curvature) of ones of the crossbars of the patterned conductive layer 14 may be different than a curvature of others of the crossbars of the patterned conductive layer 14, and a curvature of ones of the crossbars of the patterned conductive layer 24 may be different than a curvature of others of the crossbars of the patterned conductive layer 24.

In the embodiment illustrated in FIG. 5, similarly to the embodiment of FIG. 4, the crossbars of the patterned conductive layer 14 include a crossbar shape 14*aa* and a crossbar shape 14*bb*, and the crossbars of the patterned conductive layer 24 include a crossbar shape 24*aa* and a crossbar shape 24*bb*. The crossbar shapes 14*aa* are interspersed with the crossbar shapes 14*bb*, such that the crossbar shapes 14*aa* and the crossbar shapes 14*bb* are staggered, as shown. The crossbar shapes 24*aa* are interspersed with the crossbar shapes 24*bb*, such that the crossbar shapes 24*aa* and the crossbar shapes 24*bb* are staggered, as shown.

Figure 6:
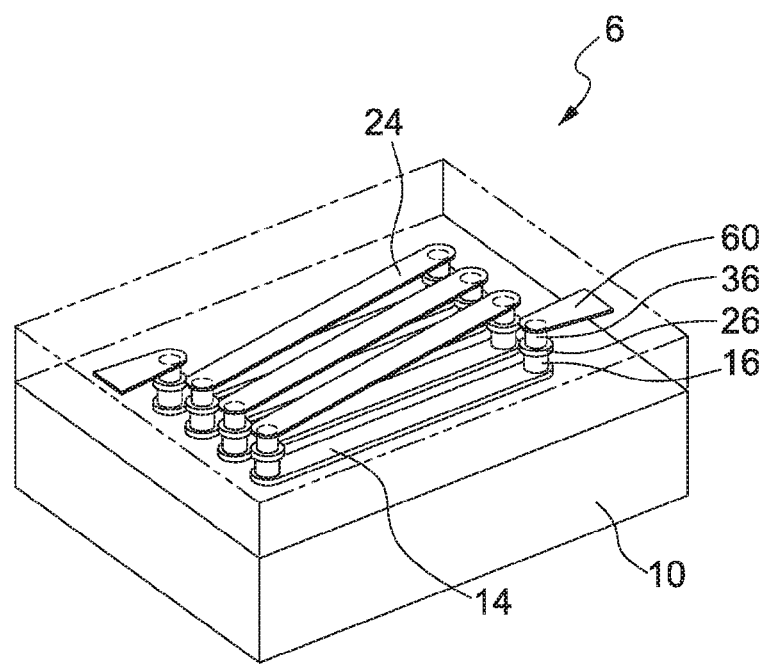
FIG. 6 is a side-sectional view of a semiconductor device in accordance with an embodiment of the present disclosure.

FIG. 6 is a perspective view of a semiconductor device 6 in accordance with an embodiment of the present disclosure. The semiconductor device 6 is similar to the semiconductor device 3 illustrated in FIG. 3, where the bend angles of the crossbars of the patterned conductive layers 14 and 24 are all approximately equal to 180 degrees.

The shapes of the crossbars illustrated in FIGS. 2-6 are not limiting, and other shapes are also possible. Further, a combination of the shapes of the crossbars illustrated in FIGS. 2-6 may be implemented in one semiconductor device.

In one or more embodiments of the semiconductor device 2, 3, 4, 5 or 6 (of FIGS. 2, 3, 4, 5, 6, respectively), a vertical distance between the crossbars of the patterned conductive layer 14 and the crossbars of the patterned conductive layer 24 are in a range of about 150 µm to about 400 µm, such as in a range of about 150 µm to about 300 µm, or about 250 µm to about 400 µm.

Although patterned conductive layers 14 and 24 are illustrated and described with respect to FIGS. 2-6, it should be understood that other patterned conductive layers (e.g., the patterned conductive layer 28 illustrated in FIG. 1) may additionally or alternatively be used to form 3D structures. For example, referring to FIG. 1, patterned conductive layers 14 and 28 may be used to form a 3D structure, patterned conductive layers 24 and 28 may be used to form a 3D structure, or patterned conductive layers 14, 24 and 28 may be used to form a 3D structure; in each of these examples, an applicable combination of interconnection structures (e.g., similar to the interconnection structures 161, 261 or 361 in FIG. 1, or similar to interconnection structures 16, 26 and 36 in FIGS. 2-6) may be used in the 3D structure.

Figure 7:
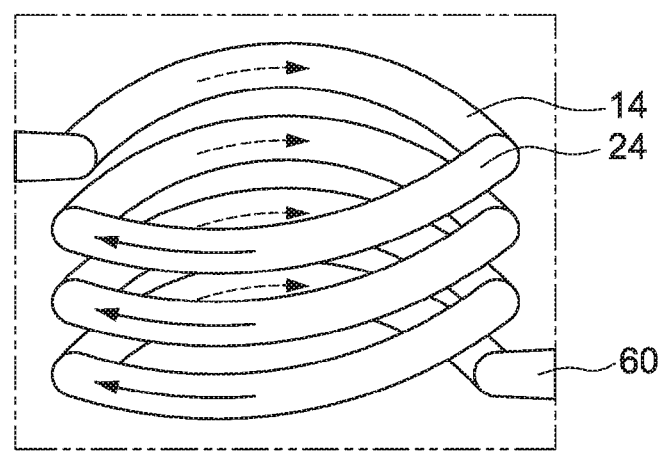
FIG. 7 is a diagram of the semiconductor device of FIG. 2.

FIG. 7 is a representative diagram of the semiconductor device 2 of FIG. 2 during operation of the semiconductor device 2, illustrating that the semiconductor device 2 operates as an inductor. A current is indicated as passing through the crossbars of the patterned conductive layer 14 in a first direction and the same current is indicated as passing through the crossbars of the patterned conductive layer 24 in a second direction. Referring again to FIG. 2, it can be envisioned that the first direction of current flow and the second direction of current flow are not parallel to each other, when the semiconductor device 2 is viewed from a top or a bottom of the device 2. Offsets of the magnetic field caused by out-of-phase current will be reduced accordingly. Thus, the Q factor of an inductor according to the present disclosure can be increased by reducing the offsets of the magnetic field caused by out-of-phase current. For example, in the embodiment illustrated in FIG. 6, the crossbars of the patterned conductive layers 14 and 24 are positioned such that a relatively small out-of-phase current develops during operation of the semiconductor device 6. A Q factor of an inductor formed in a shape (e.g., by a wire) such as the inductor of FIG. 7 may be less than the Q factor of the inductor of FIG. 6.

Table 1 summarizes results from the simulations shown in FIGS. 8A and 8B, described below. In Table 1, Q factor, Q Maximum and inductance values are shown for inductors according to the embodiments illustrated in FIGS. 2, 3 and 6, as compared to an example two-dimensional (2D) inductor design. For the inductor of FIG. 3, the bend angle of the crossbars of the patterned conductive layers 14 and 24 was set to 90 degrees.

TABLE 1

| Structure | Q factor @ 1 GHz | Q Maximum | Inductance value (nH) @ 0.5 GHz |
|---|---|---|---|
| 2D inductor (not shown) | 36.3 | 44.4 | 5.2 |
| 3D Spiral (FIG. 6) | 33.4 | 45.3 | 5.3 |
| 3D rounded shape (FIG. 2) | 37.9 | 49.4 | 5.7 |
| 3D angular (90°) (FIG. 3) | 41.0 | 50.9 | 6.4 |

Figure 8A:
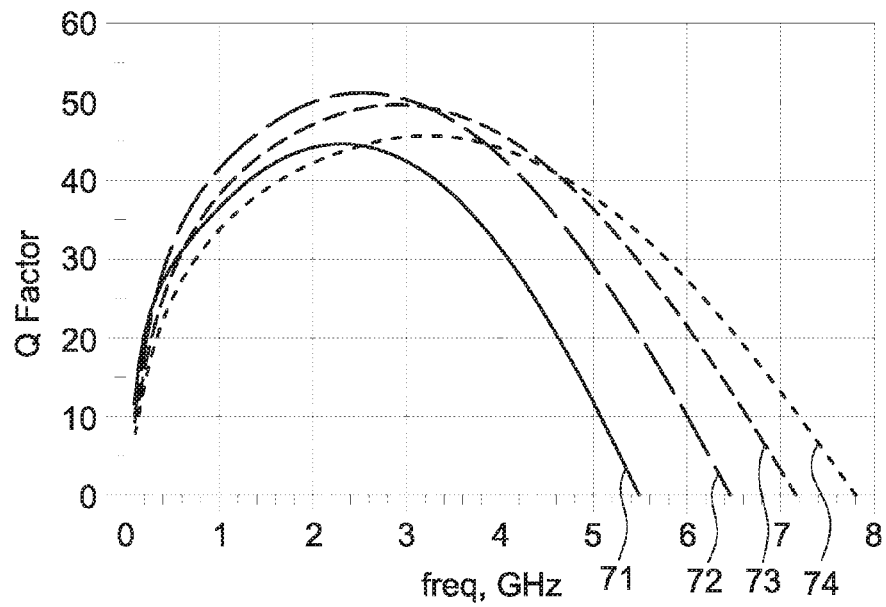
FIG. 8A and FIG. 8B provide simulation results for embodiments of the present disclosure.

FIG. 8A provides simulation results of the Q factor for the inductors of FIGS. 2, 3 and 6. A curve 71 represents the Q factor of the 2D inductor design. A curve 72 represents the Q factor of the inductor of FIG. 3. A curve 73 represents the Q factor of the inductor of FIG. 2. A curve 74 represents the Q factor of the inductor of FIG. 6. As shown in FIG. 8A, the Q factor of the inductor of FIG. 3 (i.e., the 3D angular (90°)) is better at 1 Gigahertz (GHz) and reaches a higher maximum value than the other inductor types.

Figure 8B:
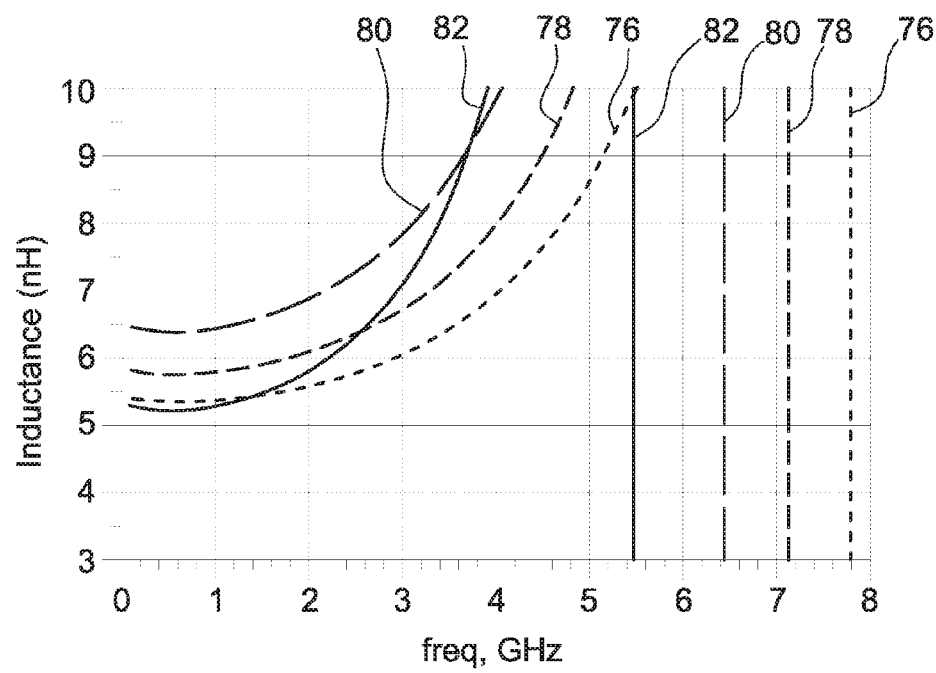

FIG. 8B provides simulation results of inductance values of the inductors of FIGS. 2, 3 and 6. A curve 82 represents the inductance value of the 2D inductor design. The curve 80 represents the inductance value of the inductor of FIG. 3. A curve 78 represents the inductance of the inductor of FIG. 2. The curve 76 represents the inductance value of the inductor of FIG. 6. As shown in FIG. 8B, the inductance value of the inductor of FIG. 3 (i.e., the 3D angular (90°)) has a larger inductance value at 0.5 GHz (and at 1 GHz) than the other inductor types.

Thus have been described semiconductor devices with embedded components therein. In embodiments of the present disclosure, an embedded component is a 3D inductor, which may be described in general terms as including top portions separated from one another; bottom portions separated from one another; and side portions separated from one other and parallel to each other, where each side portion extends between one of the top portions and one of the bottom portions.

As used herein, the terms "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, a first angle may be approximately the same as a second angle if a difference between the first angle and the second angle is less than or equal to ±10°, such as ±5°, ±4°, ±3°, ±2°, ±1°, ±0.5°, ±0.1°, or ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a substrate; and
   at least one inductor on the substrate, the inductor comprising:
   a first patterned conductive layer comprising a plurality of first top portions separated from one another and a plurality of second top portions separated from one another, the first top portions bending in a first direction, and the second top portions bending in a third direction;
   a second patterned conductive layer comprising a plurality of first bottom portions separated from one another and a plurality of second bottom portions separated from one another, the first bottom portions bending in a second direction, and the second bottom portions bending in a fourth direction; and a plurality of side portions separated from one other, each side portion extending between one of the first top portions and one of the first bottom portions;

wherein the first direction is opposite to the second direction.

2. The semiconductor device of claim 1, wherein one first top portion of the plurality of first top portions is electrically coupled to one first bottom portion of the plurality of first bottom portions through one side portion of the plurality of side portions, and the first bottom portion is electrically coupled to another first top portion of the plurality of first top portions through another one side portion of the side portions.

3. The semiconductor device of claim 2, wherein a current passes through one first top portion in a first current direction and passes to one first bottom portion through one side portion, the current passes through the first bottom portion in a second current direction and passes to another first top portion through another side portion.

4. The semiconductor device of claim 1, wherein a magnetic direction of the inductor is substantially parallel to the substrate.

5. The semiconductor device of claim 3, wherein each of the first top portions has a first bend angle and each of the first bottom portions has a second bend angle.

6. The semiconductor device of claim 5, wherein the first bend angle is about ninety degrees.

7. The semiconductor device of claim 1, wherein the first top portions have a first curvature and the first bottom portions have a second curvature.

8. The semiconductor device of claim 7, wherein the first curvature is substantially equal to the second curvature.

9. A semiconductor device, comprising:
a substrate;
a first patterned conductive layer disposed on the substrate, the first patterned conductive layer comprising a plurality of first crossbars separated from one another and a plurality of third crossbars separated from one another, the first crossbars bending in a first direction, and the third crossbars bending in a third direction;
an insulating layer disposed on the first patterned conductive layer;
a second patterned conductive layer disposed on the insulating layer, the second patterned conductive layer comprising a plurality of second crossbars separated from one another and a plurality of fourth crossbars separated from one another, and the second crossbars bending in a second direction, and the fourth crossbars bending in a fourth direction; and
a plurality of columnar structures disposed in the insulating layer and electrically coupling the first patterned conductive layer and the second patterned conductive layer.

10. The semiconductor device of claim 9, wherein each columnar structure electrically couples a corresponding first crossbar and a corresponding second crossbar.

11. The semiconductor device of claim 9, wherein each of the first crossbars has a first bend angle, each of the second crossbar has a second bend angle, and the first bend angle and the second bend angle are about ninety degrees.

12. The semiconductor device of claim 9, wherein a current sequentially passes through one first crossbar, one second crossbar, one third crossbar and one fourth crossbar through at least a portion of the columnar structures.

13. The semiconductor device of claim 12, wherein the first direction is opposite to the second direction and the third direction is different from the fourth direction.

14. The semiconductor device of claim 13, wherein the third direction is opposite to the fourth direction.

15. The semiconductor device of claim 9, wherein each of the first crossbars has a first bend angle, each of the third crossbars has a third bend angle, and the first bend angle is different from the third bend angle.

16. The semiconductor device of claim 9, wherein each of the first crossbars has a first curvature, each of the third crossbars has a third curvature, and the first curvature is different from the third curvature.

17. A semiconductor device, comprising:
a substrate;
a first patterned conductive layer disposed over the substrate, the first patterned conductive layer comprising a plurality of first crossbars separated from one another and a plurality of third crossbars separated from one another, the first crossbars bending in a first direction, and the third crossbars bending in a third direction;
a second patterned conductive layer disposed over the second conductive layer, the second patterned conductive layer comprising a plurality of second crossbars separated from one another and a plurality of fourth crossbars separated from one another, the second crossbars bending in a second direction, and the fourth crossbars bending in a fourth direction;
a plurality of columnar structures disposed between the first crossbars and the second crossbars and electrically coupling the first crossbars and the second crossbars;
wherein one first crossbar of the first patterned conductive layer is electrically coupled to one second crossbar of the second patterned conductive layer through one columnar structure, and the one second crossbar of the second patterned conductive layer is electrically coupled to another one first crossbar of the first patterned conductive layer through another one columnar structure.

18. The semiconductor device of claim 17, wherein the first crossbars, the second crossbars and the columnar structures form at least one electrical path and form at least one inductor.

19. The semiconductor device of claim 18, wherein the electrical path has a magnetic direction and the magnetic direction is substantially parallel to the substrate.

* * * * *